(12) United States Patent
Kim

(10) Patent No.: US 11,742,018 B2
(45) Date of Patent: Aug. 29, 2023

(54) SIGNAL GENERATOR FOR GENERATING CONTROL SIGNALS FOR PAGE BUFFER OF MEMORY DEVICE

(71) Applicant: SK hynix Inc., Icheon-si (KR)

(72) Inventor: Young Il Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/979,591

(22) Filed: Nov. 2, 2022

(65) Prior Publication Data

US 2023/0057251 A1 Feb. 23, 2023

Related U.S. Application Data

(62) Division of application No. 17/003,753, filed on Aug. 26, 2020, now Pat. No. 11,521,671.

(30) Foreign Application Priority Data

Mar. 26, 2020 (KR) ........................ 10-2020-0036672

(51) Int. Cl.
| | |
|---|---|
| *G11C 7/08* | (2006.01) |
| *G11C 11/4091* | (2006.01) |
| *G11C 16/26* | (2006.01) |
| *G11C 16/24* | (2006.01) |
| *G11C 16/06* | (2006.01) |
| *G11C 16/04* | (2006.01) |
| *G11C 7/10* | (2006.01) |

(52) U.S. Cl.
CPC ............ *G11C 11/4091* (2013.01); *G11C 7/08* (2013.01); *G11C 16/06* (2013.01); *G11C 16/24* (2013.01); *G11C 16/26* (2013.01); *G11C 7/1057* (2013.01); *G11C 16/0483* (2013.01)

(58) Field of Classification Search
CPC ...... G11C 16/24; G11C 16/26; G11C 16/0483
See application file for complete search history.

(56) References Cited

U.S. PATENT DOCUMENTS

| | | | |
|---|---|---|---|
| 9,659,665 B1 * | 5/2017 | Kim ................... | G11C 16/0483 |
| 9,859,008 B1 * | 1/2018 | Kim ....................... | G11C 16/26 |
| 2010/0182840 A1 | 7/2010 | Wang et al. | |
| 2011/0267892 A1 * | 11/2011 | Kim ....................... | G11C 16/26 |
| | | | 365/185.21 |
| 2013/0002217 A1 * | 1/2013 | Kim ....................... | G11C 5/147 |
| | | | 323/275 |
| 2017/0256293 A1 * | 9/2017 | Yuk .................. | H03K 3/356104 |

(Continued)

FOREIGN PATENT DOCUMENTS

| | | | | |
|---|---|---|---|---|
| CN | 112037839 A | * | 12/2020 | ............ G11C 16/08 |
| CN | 112037839 A | | 12/2020 | |

(Continued)

*Primary Examiner* — Mushfique Siddique

(74) *Attorney, Agent, or Firm* — WILLIAM PARK & ASSOCIATES LTD.

(57) ABSTRACT

A signal generator includes a first amplifier for outputting an amplified voltage in response to a reference voltage and a feedback voltage, a divider circuit for dividing the amplified voltage to generate a divided voltage and the feedback voltage, and a buffer group for outputting a common sensing signal in response to the amplified voltage and outputting a sensing signal in response to the divided voltage, and a memory device including the signal generator.

6 Claims, 7 Drawing Sheets

(56) References Cited

U.S. PATENT DOCUMENTS

2019/0221275 A1    7/2019  Chai et al.
2020/0381055 A1*  12/2020  Ko ......................... G11C 16/08
2022/0020436 A1*   1/2022  Choi .................. G11C 16/3459

FOREIGN PATENT DOCUMENTS

KR     1020140063146 A    5/2014
KR       101736501 B1     5/2017

\* cited by examiner

SIGNAL GENERATOR FOR GENERATING CONTROL SIGNALS FOR PAGE BUFFER OF MEMORY DEVICE

CROSS-REFERENCE TO RELATED APPLICATION

The present application is a divisional application of U.S. patent application Ser. No. 17/003,753, filed on Aug. 26, 2020, and claims priority under 35 U.S.C. § 119(a) to Korean patent application number 10-2020-0036672 filed on Mar. 26, 2020, in the Korean Intellectual Property Office, the entire disclosure of which is incorporated herein by reference herein.

BACKGROUND

1. Technical Field

Various embodiments relate to a signal generator and a memory device having the same, and more particularly, to a signal generator generating signals for controlling a page buffer of a memory device, and the memory device including the signal generator.

2. Related Art

A memory device may include volatile memory that loses stored data in the absence of supplied power and/or non-volatile memory that maintains stored data in the absence of supplied power.

Examples of volatile memory may include dynamic random-access memory (DRAM) and static random-access memory (SRAM). Examples of non-volatile memory may include read-only memory (ROM), programmable read-only memory (PROM), erasable PROM (EPROM), electrically EPROM (EEPROM), and flash memory.

A memory device may include a memory cell array, peripheral circuits, and a logic circuit.

The memory cell array may include a plurality of memory cells, and the plurality of memory cells may store data.

The peripheral circuits may be configured to program data into a memory cell array, read the programmed data, or erase the programmed data.

A logic circuit may be configured to control the peripheral circuits in response to a command and an address. The logic circuit may include software performing an algorithm in response to a command and hardware outputting various signals according to the algorithm. For example, the logic circuit may include a signal output circuit configured to generate and output page buffer control signals.

SUMMARY

Various embodiments of the present disclosure provide a signal generator for generating signals for controlling signals for controlling peripheral circuits at an accurate time, and a method of operating the same.

According to an embodiment, a signal generator may include a first amplifier for outputting an amplified voltage in response to a reference voltage and a feedback voltage, a divider circuit for dividing the amplified voltage to generate a divided voltage and the feedback voltage, and a buffer group for outputting a common sensing signal in response to the amplified voltage and outputting a sensing signal in response to the divided voltage.

According to an embodiment, a memory device may include a memory block for storing data, page buffers coupled to the memory block through bit lines, and a signal generator for outputting page control signals for controlling the page buffers. The signal generator is configured to output a common sensing signal and a sensing signal included in the page control signals in response to an amplified voltage and a divided voltage generated through a single feedback loop. The page buffers are configured to precharge the bit lines, or sense a voltage or current in the bit lines in response to the page control signals including the common sensing signal and the sensing signal.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification. Advantages and features of the present teachings and methods for achieving them will be made clear from embodiments described below in detail with reference to the accompanying drawings. However, they may be embodied in different forms and should not be construed as limited to the embodiments set forth herein. Rather, these embodiments are provided so that this disclosure will be enabling to those skilled in the art.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

Figure 1:
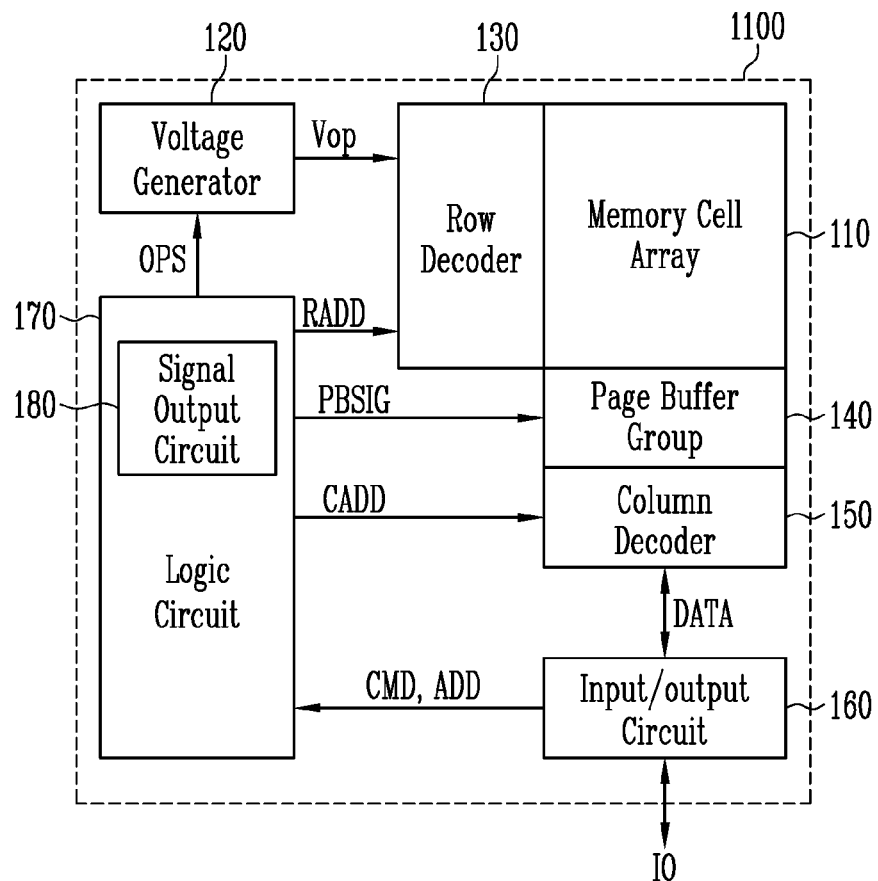
FIG. 1 is a diagram illustrating a memory device according to an embodiment.

FIG. 1 is a diagram illustrating a memory device 1100 according to an embodiment.

Referring to FIG. 1, the memory device 1100 may include a memory cell array 110 that stores data, peripheral circuits 120 to 160 that perform a program, read or erase operation, and a control logic 170 that controls the peripheral circuits 120 to 160.

The memory cell array 110 may include a plurality of memory blocks storing data. Each of the memory blocks may include a plurality of memory cells, and these memory cells may have a two-dimensional (2D) structure in which the memory cells are arranged in parallel with a substrate, or a three-dimensional (3D) structure in which the memory cells are stacked in a vertical direction to the substrate.

The peripheral circuits 120 to 160 may include a voltage generator 120, a row decoder 130, a page buffer group 140, a column decoder 150, and an input/output circuit 160.

The voltage generator 120 may generate and output operating voltages Vop necessary for various operations in response to an operating signal OPS. For example, the voltage generator 120 may generate and output a program voltage, a verify voltage, a read voltage, a pass voltage, and an erase voltage.

The row decoder 130 may select one memory block, among memory blocks included in the memory cell array 110, according to a row address RADD, and may transfer the operating voltages Vop to the selected memory block.

The page buffer group 140 may be coupled to the memory cell array 110 through bit lines. For example, the page buffer group 140 may include page buffers coupled to the bit lines, respectively. The page buffers may operate at the same time in response to page buffer control signals PBSIG, and may temporarily store data during a program or read operation. For example, the page buffers may precharge the bit lines, or sense a voltage or current in the bit lines in response to the page buffer control signals PBSIG. Each of the page buffers may include a plurality of latches temporarily storing data. The number of latches may vary depending on a program method. For example, the design of the page buffers may vary depending on the number of bits to be stored in a single memory cell, or depending on the number of verify voltages used during a verify operation. In addition, verify voltages may be used to determine various threshold voltages of memory cells to be programmed with the same target voltage.

The column decoder 150 may transfer data DATA between the input/output circuit 160 and the page buffer group 140 in response to a column address CADD.

The input/output circuit 160 may be coupled to a controller 1200 through input/output lines IO. The input/output circuit 160 may transmit and receive a command CMD, addresses ADD, and the data DATA through the input/output lines IO. For example, the input/output circuit 160 may transfer the command CMD and the address ADD, received from the input/output lines IO, to the logic circuit 170, and may transfer the data DATA, received through the input/output lines IO, to the column decoder 150. The input/output circuit 160 may output the data DATA received from the column decoder 150 to an external device.

The logic circuit 170 may output the operating signals OPS, the row address RADD, the page buffer control signals PBSIG and the column address CADD in response to the command CMD and the address ADD. For example, the logic circuit 170 may include software for performing an algorithm in response to the command CMD and hardware configured to output various signals according to the address ADD and the algorithm. For example, the logic circuit 170 may include a signal output circuit 180 configured to generate and output the page buffer control signals PBSIG.

Figure 2:
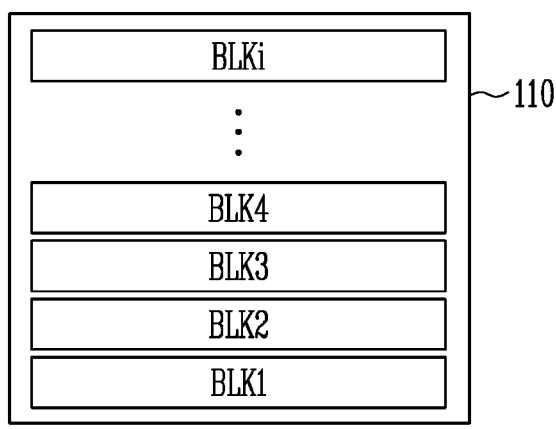
FIG. 2 is a diagram illustrating a memory cell array.

FIG. 2 is a diagram illustrating the memory cell array 110.

Referring to FIG. 2, the memory cell array 110 may include first to ith memory blocks BLK1 to BLKi, where i is a positive integer. The first to ith memory blocks BLK1 to BLKi each may include a plurality of memory cells and have the same configuration. The first to ith memory blocks BLK1 to BLKi may have a 2D or 3D structure. The 2D structure may refer to a structure in which the memory cells are arranged in parallel with respect to a substrate, and the 3D structure may refer to a structure in which the memory cells are stacked in a vertical direction to the substrate.

Figure 3:
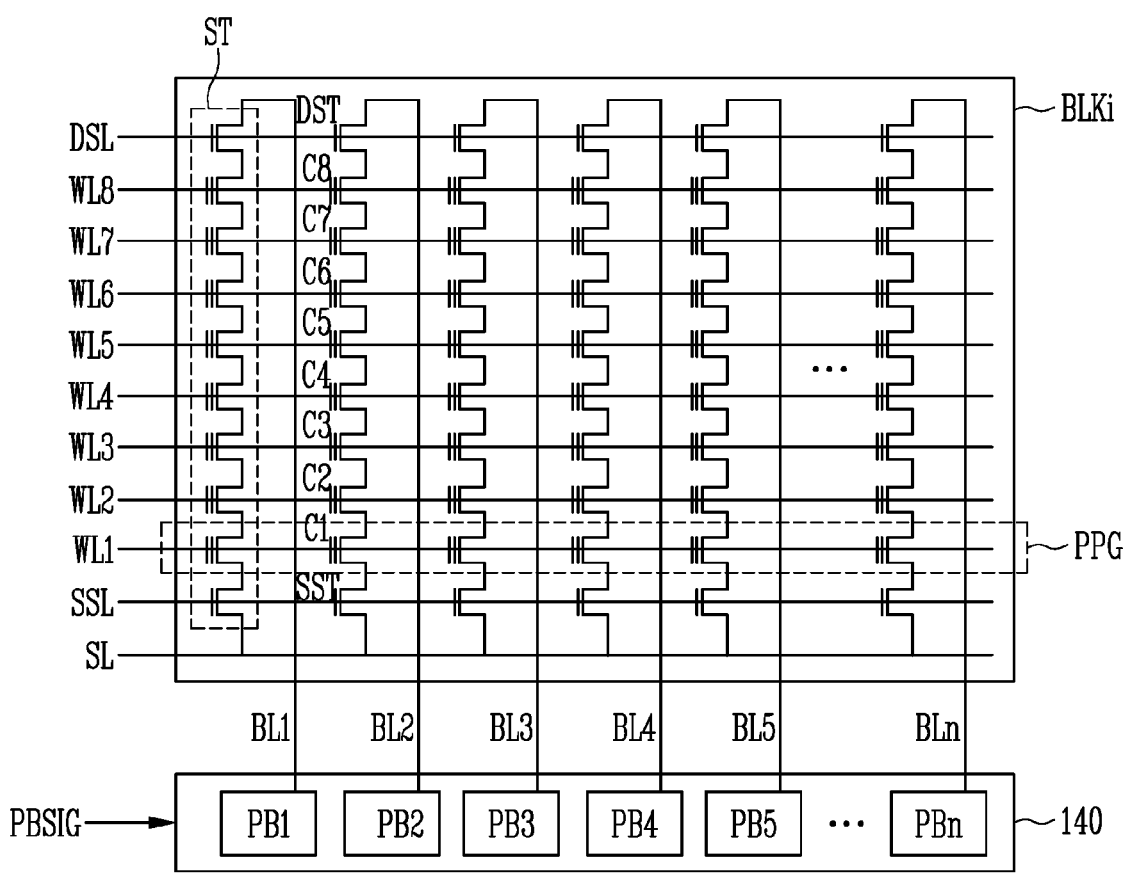
FIG. 3 is a diagram illustrating a relationship between a memory block and a page buffer group.

FIG. 3 is a diagram illustrating the connection relationship between a memory block and a page buffer group.

Referring to FIG. 3, an ith memory block BLKi may include a plurality of strings ST coupled between first to nth bit lines BL1 to BLn, where n is a positive integer, and a source line SL. Each of the strings ST may include a source select transistor SST, first to eighth memory cells C1 to C8, and a drain select transistor DST coupled in series between the source line SL and the first to nth bit lines BL1 to BLn. In other words, one string ST may be coupled between one bit line (e.g., BL1) and the source line SL, and the string ST may include the source select transistor SST, the first to eighth memory cells C1 to C8, and the drain select transistor DST.

The ith memory block BLKi of FIG. 3 is shown to describe one possible configuration of a memory block. Other configurations are also possible. For example, the numbers of source select transistors SST, first to eighth memory cells C1 to C8, and drain select transistors DST is not limited to those shown in FIG. 3.

Gates of the source select transistors SST coupled to different strings ST may be commonly coupled to a source select line SSL, gates of each of the first to eighth memory cells C1 to C8 may be coupled to first to eighth word lines WL1 to WL8, respectively, and gates of the drain select transistors DST coupled to different strings ST may be commonly coupled to a drain select line DSL.

Memory cells coupled to the same word line and included in different strings ST may form a single physical page PPG. Memory cells may be programmed or read in units of physical pages PPG.

The first to nth bit lines BL1 to BLn may be coupled to the first to nth page buffers PB1 to PBn included in the page buffer group 140.

The first to nth page buffers PB1 to PBn may operate at the same time in response to the page buffer control signals PBSIG. During a program operation, the first to nth page buffers PB1 to PBn may precharge the first to nth bit lines BL1 to BLn, or may sense voltages or currents in the first to nth bit lines BL1 to BLn in response to the page buffer control signals PBSIG. For example, the page buffer control signals PBSIG may be commonly applied to the first to nth page buffers PB1 to PBn. The first to nth page buffers PB1 to PBn may be commonly operated in response to the page buffer control signals PBSIG. Therefore, control of the page buffer control signals PBSIG may affect the reliability of the memory device.

Because first to nth page buffers PB1 to PBn may have the same configuration, the nth page buffer PBn is described below as an example.

Figure 4:
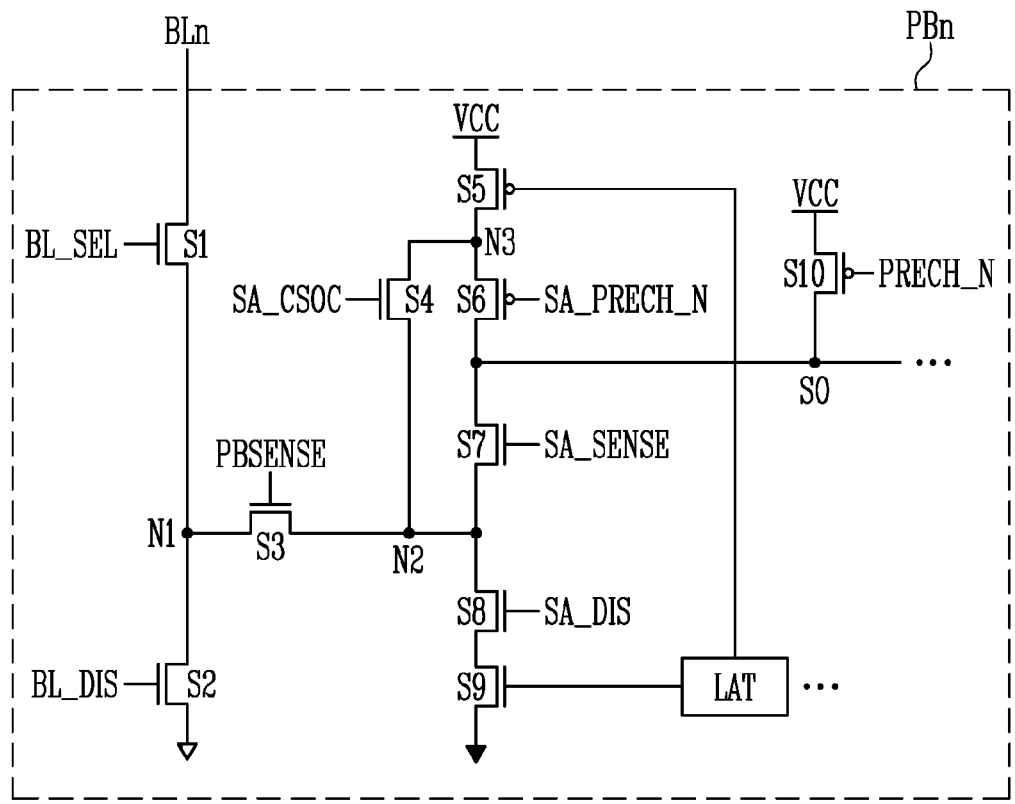
FIG. 4 is a circuit diagram illustrating an nth page buffer.

FIG. 4 is a circuit diagram illustrating the nth page buffer PBn.

Referring to FIG. 4, the nth page buffer PBn may include a plurality of switches. FIG. 4 illustrates only a portion of the nth page buffer PBn for a better understanding of this embodiment.

The nth page buffer PBn may include first to tenth switches S1 to S10 and a latch LAT. The nth page buffer PBn may include a plurality of latches LAT. However, for convenience of explanation, only one of the latches LAT is shown in FIG. 4.

The first switch S1 may include an NMOS transistor that is turned on or off in response to a bit line select signal BL_SEL. For example, when the first switch S1 is turned on, a voltage of a first node N1 may be transferred to the nth bit line BLn, or a voltage or current in the nth bit line BLn may be transferred to the first node N1. The second switch S2 may include an NMOS transistor that connects or disconnects the first node N1 and the ground terminal to or from each other in response to a bit line discharge signal BL_DIS. For example, when the second switch S2 is turned on, the first node N1 may be discharged.

The third switch S3 may include an NMOS transistor that connects or disconnects the first node N1 and a second node N2 to or from each other in response to a sensing signal PBSENSE. The amount of voltage or current transferred between the nth bit line BLn and a sensing node SO may be controlled depending on a level of the sensing signal PBSENSE. The fourth switch S4 may include an NMOS transistor that connects or disconnects the second node N2 and a third node N3 to or from each other in response to a common sensing signal SA_CSOC. When the voltage or current of the nth bit line BLn is sensed, turn-on levels of the third and fourth switches S3 and S4 may affect a level of the sensed voltage or current. In addition, electrical characteristics of the third and fourth switches S3 and S4 may be changed according to the temperature. It may be necessary to control the levels of the sensing signal PBSENSE and the common sensing signal SA_CSOC so as not to be influenced by the above factors because these levels are important to sense data of a memory cell.

The fifth switch S5 may include a PMOS transistor that supplies a power supply voltage VCC to the third node N3 or blocks the supply of the power supply voltage VCC, depending on the data stored in the latch LAT. The sixth switch S6 may include a PMOS transistor that connects or disconnects the third node N3 and the sensing node SO to or from each other in response to a sensing node precharge signal SA_PRECH_N. The seventh switch S7 may include an NMOS transistor that connects or disconnects the sensing node SO and the second node N2 to or from each other in response to a sensing node sensing signal SA_SENSE. The eighth and ninth switches S8 and S9 may discharge the second node N2 depending on a sensing node discharge signal SA_DIS and the data record in the latch LAT. The eighth switch S8 may be coupled between the second node N2 and the ninth switch S9, and the ninth switch S9 may be coupled between the eighth switch S8 and the ground terminal. The eighth switch S8 may be turned on or off in response to the sensing node discharge signal SA_DIS, and the ninth switch S9 may be turned on or off according to the data stored in the latch LAT. Therefore, the second node N2 may be discharged when both the eighth and ninth switches S8 and S9 are turned on. The tenth switch S10 may include a PMOS transistor that supplies or blocks the power supply voltage VCC to the sensing node SO in response to a precharge signal PRECH_N.

In addition to the above-described switches, the nth page buffer PBn may further include a plurality of latches and a plurality of switches between the plurality of latches to transfer data.

Figure 5:
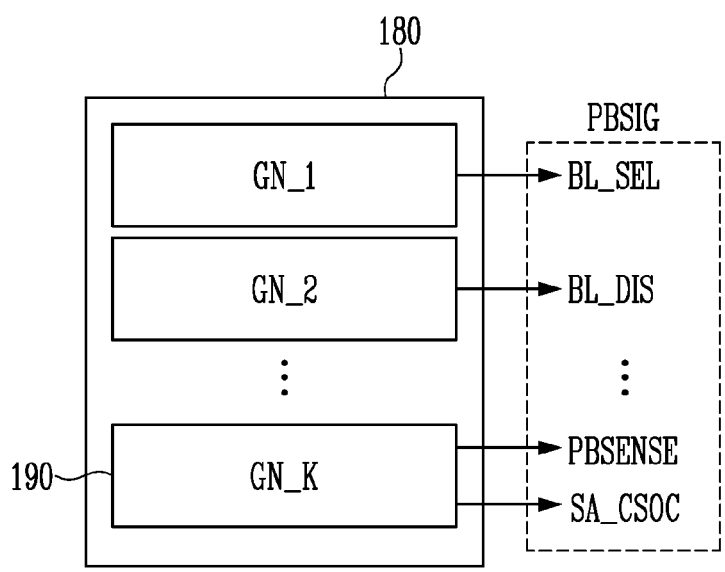
FIG. 5 is a diagram illustrating a signal output circuit.

FIG. 5 is a diagram illustrating the signal output circuit 180.

Referring to FIG. 5, the signal output circuit 180 may generate and output the page buffer control signals PBSIG having various levels. The page buffer control signals PBSIG may include the signals BL_SEL, BL_DIS, . . . , PBSENSE, and SA_CSOC as described above with reference to FIG. 4. In other words, the page buffer control signals PBSIG for controlling the first to nth page buffers PB1 to PBn as shown in FIG. 3 may be generated and output by the signal output circuit 180.

To generate and output the page buffer control signals PBSIG having various levels, the signal output circuit 180 may include a plurality of signal generation units GN_1 to GN_K, where K is a positive integer. For example, the first signal generation unit GN_1 may generate and output the bit line select signal BL_SEL, the second signal generation unit GN_2 may generate and output the bit line discharge signal BL_DIS, and the Kth signal generation unit GN_K may generate and output the sensing signal PBSENSE and the common sensing signal SA_CSOC.

The levels of the sensing signal PBSENSE and the common sensing signal SA_CSOC may be important for a sensing operation. Therefore, in this embodiment, the Kth signal generation unit (GN_K) 190 generating the sensing signal PBSENSE and the common sensing signal SA_CSOC is described in more detail. The Kth signal generation unit (GN_K) 190 may be referred to as the Kth signal generator 190.

Figure 6A:
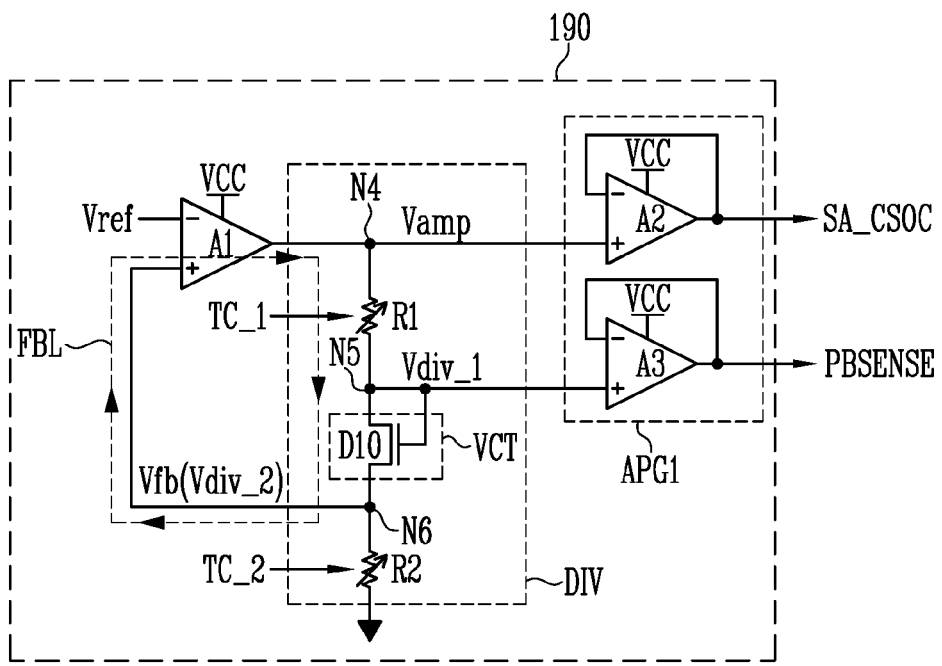
FIG. 6A is a circuit diagram illustrating a signal generator according to a first embodiment of the present disclosure.

FIG. 6A is a circuit diagram illustrating the Kth signal generator 190 according to a first embodiment of the present disclosure.

Referring to FIG. 6A, the Kth signal generator 190 may include a first amplifier A1, a divider circuit DIV, and a first buffer group APG1.

The first amplifier A1 may operate with the supply of the power supply voltage VCC and output an amplified voltage Vamp in response to a reference voltage Vref and a feedback voltage Vfb. The reference voltage Vref may be applied to an input terminal (−) of the first amplifier A1 and the feedback voltage Vfb may be applied to an input terminal (+) of the first amplifier A1. The first amplifier A1 may amplify a voltage difference between the reference voltage Vref and the feedback voltage Vfb to output the amplified voltage Vamp to a fourth node N4. The feedback voltage Vfb may be a second divided voltage Vdiv_2 output from the divider circuit DIV.

The divider circuit DIV may be coupled between the fourth node N4 and a ground terminal. The divider circuit DIV may include a first variable resistor R1, a voltage regulator VCT, and a second variable resistor R2. The first variable resistor R1 may be coupled between the fourth node N4 and a fifth node N5, the voltage regulator VCT may be coupled between the fifth node N5 and a sixth node N6, and the second variable resistor R2 may be coupled between the sixth node N6 and the ground terminal.

A resistance value of the first variable resistor R1 may be varied in response to a first trim code TC_1 consisting of a plurality of bits.

The voltage regulator VCT may include a diode D10 through which current flows from the fifth node N5 to the sixth node N6. To reduce dispersion or deviation of the sensing signal PBSENSE applied to a gate of the third switch S3 of FIG. 4, which is included in the page buffer PBn of FIG. 4, the diode D10 may include the same transistor as the third switch S3 of FIG. 4. For example, the diode D10 may include a transistor having the same material, structure, and size as the third switch S3 included in the page buffer PBn of FIG. 4, and may have the same threshold voltage as the third switch S3.

A resistance value of the second variable resistor R2 may be varied in response to a second trim code TC_2 consisting of a plurality of bits. Because the second variable resistor R2 is more adjacent to the ground terminal than the first variable resistor R1, the second trim code TC_2 may consist of more bits than the first trim code TC_1 in order to minutely control first and second divided voltages Vdiv_1 and Vdiv_2. For example, when the first trim code TC_1 includes a four-bit code, the second trim code TC_2 may include a six-bit code which is greater than the four-bit code of the first trim code TC_1. However, the number of bits of each of the first and second trim codes TC_1 and TC_2 is not limited thereto.

The sixth node N6 may be coupled to the input terminal (+) of the first amplifier A1. Therefore, the second divided voltage Vdiv_2 corresponding to the potential of the sixth node N6 may be applied as a feedback voltage Vfd to the input terminal (+) of the first amplifier A1.

Therefore, a feedback loop FBL may be formed in such a manner that the amplified voltage Vamp output from the first amplifier A1 may be divided by the first variable resistor R1, the voltage regulator VCT and the second variable resistor R2, and the divided voltage may be applied to the input terminal (+) of the first amplifier A1.

The first buffer group APG1 may include a second amplifier A2 coupled to the fourth node N4 and a third amplifier A3 coupled to the fifth node N5. The first to third amplifiers A1 to A3 may operate with the supply of the same power supply voltage VCC. An input terminal (+) of the second amplifier A2 may be coupled to the fourth node N4, and an input terminal (−) thereof may be coupled to an output node of the second amplifier A2. In other words, a voltage output from the second amplifier A2 may be applied as the common sensing signal SA_CSOC to the page buffer and applied again to the input terminal (−) of the second amplifier A2. An input terminal (+) of the third amplifier A3 may be coupled to the fifth node N5, and an input terminal (−) thereof may be coupled to an output node of the third amplifier A3. In other words, a voltage output from the third amplifier A3 may be applied as the sensing signal PBSENSE to the page buffer and applied again to the input terminal (−) of the third amplifier A3.

The common sensing signal SA_CSOC may vary depending on the amplified voltage Vamp and the sensing signal PBSENSE may vary depending on the first divided voltage Vdiv_1. Therefore, the levels of the common sensing signal SA_CSOC and the sensing signal PBSENSE may vary depending on the voltage generated in the feedback loop FBL. In other words, because the sensing signal PBSENSE is generated using the amplified voltage Vamp for generating the common sensing signal SA_CSOC as a power source, the difference between the level of the sensing signal PBSENSE and the level of the common sensing signal SA_CSOC may be kept constant.

Figure 6B:
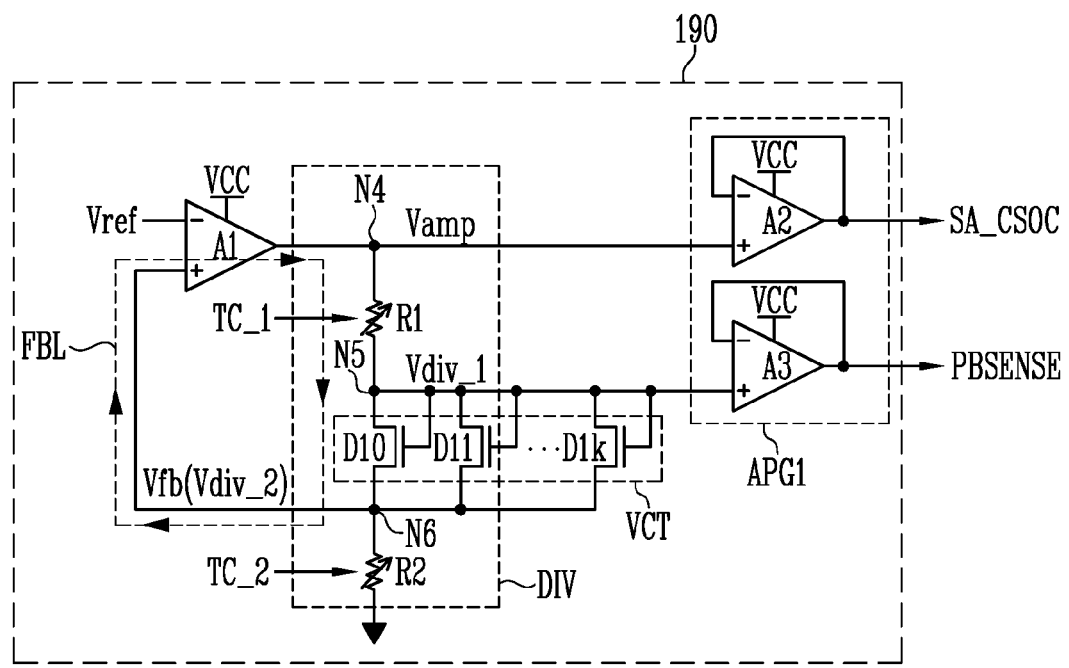
FIG. 6B is a circuit diagram illustrating a signal generator according to a second embodiment of the present disclosure.

FIG. 6B is a circuit diagram illustrating the signal generator 190 according to a second embodiment of the present disclosure.

Referring to FIG. 6B, the signal generator 190 according to the second embodiment may have a similar configuration to that of the first embodiment. Thus, a description of overlapping compositions with the first embodiment is omitted. In the second embodiment, the voltage regulator VCT may include a plurality of diodes D10 to D1k, where k is a positive integer. The plurality of diodes D10 to D1k may be coupled in parallel with each other between the fifth node N5 and the sixth node N6 and enable current to flow in the same direction. Each of the transistors included in the plurality of diodes D10 to D1k may be the same as the transistor of the third switch S3 of FIG. 4 included in the page buffer PBn of FIG. 4. For example, each of the transistors included in the plurality of diodes D10 to D1k may include the same material, structure, and size as the third switch S3 included in the page buffer PBn of FIG. 4, and may have the same threshold voltage as the third switch S3.

As there are more diodes D10 to D1k, the first divided voltage Vdiv_1 may be more stably output, so that dispersion or deviation of the sensing signal PBSENSE applied to the third switch S3 of the page buffer may be more reduced. In other words, as the number of diodes D10 to D1k increases, the sensing signal PBSENSE may maintain a constant level.

Figure 6C:
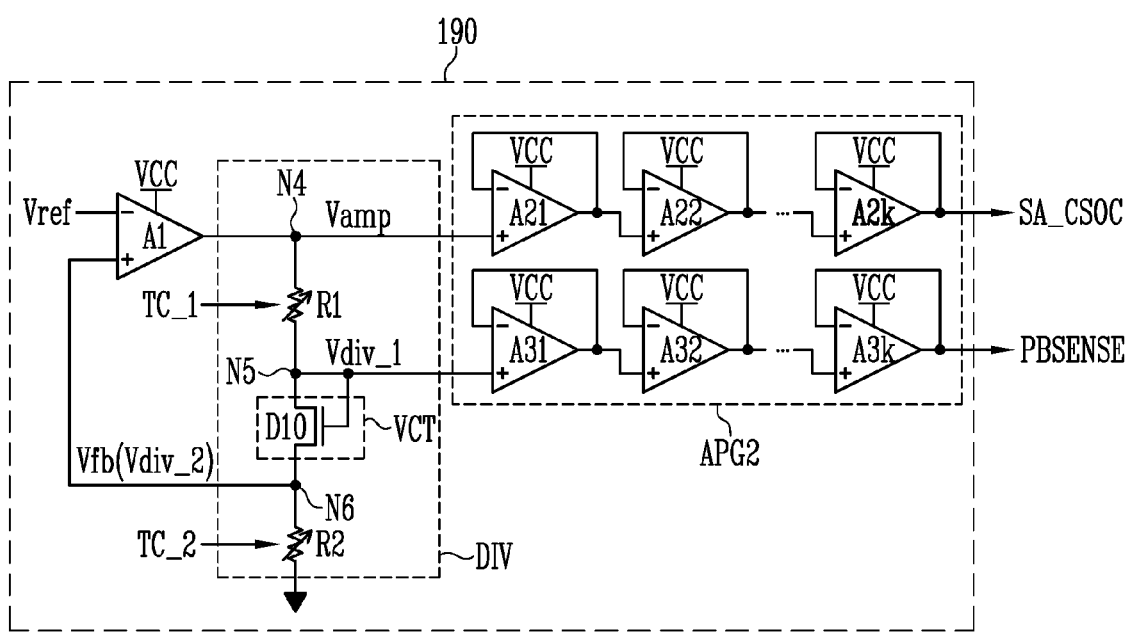
FIG. 6C is a circuit diagram illustrating a signal generator according to a third embodiment of the present disclosure.

FIG. 6C is a circuit diagram illustrating the Kth signal generator 190 according to a third embodiment of the present disclosure.

Referring to FIG. 6C, the Kth signal generator 190 may include the first amplifier A1, the divider circuit DIV, and a second buffer group APG2.

The first amplifier A1 may operate with the supply of the power supply voltage VCC and output the amplified voltage Vamp in response to the reference voltage Vref and the feedback voltage Vfb. The reference voltage Vref may be applied to an input terminal (−) of the first amplifier A1 and the feedback voltage Vfb may be applied to an input terminal (+) of the first amplifier A1. The first amplifier A1 may amplify a voltage difference between the reference voltage Vref and the feedback voltage Vfb to output the amplified voltage Vamp to the fourth node N4. The feedback voltage Vfb may be the second divided voltage Vdiv_2 output from the divider circuit DIV.

The divider circuit DIV may be coupled between the fourth node N4 and a ground terminal. The divider circuit DIV may include the first variable resistor R1, the voltage regulator VCT, and the second variable resistor R2. The first variable resistor R1 may be coupled between the fourth node N4 and the fifth node N5, the voltage regulator VCT may be coupled between the fifth node N5 and the sixth node N6, and the second variable resistor R2 may be coupled between the sixth node N6 and the ground terminal.

A resistance value of the first variable resistor R1 may be varied in response to the first trim code TC_1 consisting of a plurality of bits.

The voltage regulator VCT may include the diode D10 through which current flows from the fifth node N5 to the sixth node N6. To reduce dispersion or deviation of the sensing signal PBSENSE applied to a gate of the third switch S3 of FIG. 4, which is included in the page buffer PBn of FIG. 4, the diode D10 may include the same transistor as the third switch S3 of FIG. 4. For example, the diode D10 may include a transistor having the same material, structure, and size as the third switch S3 included in the page buffer PBn of FIG. 4, and may have the same threshold voltage as the third switch S3.

A resistance value of the second variable resistor R2 may be varied in response to the second trim code TC_2 consisting of a plurality of bits. Because the second variable resistor R2 is more adjacent to the ground terminal than the first variable resistor R1, the second trim code TC_2 may consist of more bits than the first trim code TC_1 in order to minutely control the first and second divided voltages Vdiv_1 and Vdiv_2. For example, when the first trim code TC_1 consists of four bits, the second trim code TC_2 may include six bits greater than the four bits of the first trim code TC_1. However, the number of bits of each of the first and second trim codes TC_1 and TC_2 is not limited thereto.

The sixth node N6 may be coupled to the input terminal (+) of the first amplifier A1. Therefore, the second divided voltage Vdiv_2 corresponding to the potential of the sixth node N6 may be applied as the feedback voltage Vfd to the input terminal (+) of the first amplifier A1.

Therefore, the feedback loop FBL may be formed in such a manner that the amplified voltage Vamp output from the first amplifier A1 may be divided by the first variable resistor R1, the voltage regulator VCT, and the second variable resistor R2, and the divided voltage may be applied to the input terminal (+) of the first amplifier A1.

The second buffer group APG2 may include a plurality of amplifiers A21 to A1k and A31 to A3k generating the common sensing signal SA_CSOC and the sensing signal PBSENSE in response to the amplified voltage Vamp and the first divided voltage Vdiv_1. More specifically, 21st to 2k-th amplifiers A21 to A2k may output the common sensing signal SA_CSOC according to the amplified voltage Vamp. In addition, 31st to 3k-th amplifiers A31 to A3k may output the sensing signal PBSENSE in response to the first divided voltage Vdiv_1. The first amplifier A1, the 21st to 2k-th amplifiers A21 to A2k and the 31st to 3k-th amplifiers A31 to A3k may operate with the supply of the same power supply voltage VCC.

The 21st to 2k-th amplifiers A21 to A2k may be coupled in series between the fourth node N4 and the final output node. An input terminal (+) of the 21st amplifier A21 may be coupled to the fourth node N4, and an input terminal (−) thereof may be coupled to an output node of the 21st amplifier A21. The output node of the 21st amplifier A21 may be coupled to an input terminal (+) of the next amplifier, i.e., the 22nd amplifier A22. In other words, the input terminal (+) of the 22nd amplifier A22 may be coupled to the output node of the previous amplifier, i.e., the 21st amplifier A21, and an output node of the 22nd amplifier A22 may be coupled to an input terminal (−) of the 22nd amplifier A22 and an input terminal (+) of the next amplifier. In this manner, the 21st to 2k-th amplifiers A21 to A2k may be coupled to the 21st to 2k-th amplifiers A21 to A2k, and a signal output from the lastly coupled 2k-th amplifier A2k may be used as the common sensing signal SA_CSOC.

The 31st to 3k-th amplifiers A31 to A3k may be coupled in series between the fifth node N5 and the final output node. An input terminal (+) of the 31st amplifier A31 may be coupled to the fifth node N5, and an input terminal (−) thereof may be coupled to an output node of the 31st amplifier A31. The output node of the 31st amplifier A31 may be coupled to an input terminal (+) of the next amplifier, i.e., the 32nd amplifier A32. In other words, the input terminal (+) of the 32nd amplifier A32 may be coupled to the output node of the previous amplifier, i.e., the 31st amplifier A31, and an output node of the 32nd amplifier A32 may be coupled to an input terminal (−) of the 32nd amplifier A32 and an input terminal (+) of the next amplifier. In this manner, the 31st to 3k-th amplifiers A31 to A3k may be coupled to each other in series, and a signal output from the lastly coupled 3k-th amplifier A3k may be used as the sensing signal PBSENSE.

The second buffer group APG2 as shown in FIG. 6C may simultaneously output the common sensing signal SA_CSOC and the sensing signal PBSENSE by using the amplified voltage Vamp as a power supply source. Therefore, in the Kth signal generator 190 of FIG. 6C, the difference between the level of the sensing signal PBSENSE and the level of the common sensing signal SA_CSOC may be kept constant.

Figure 6D:
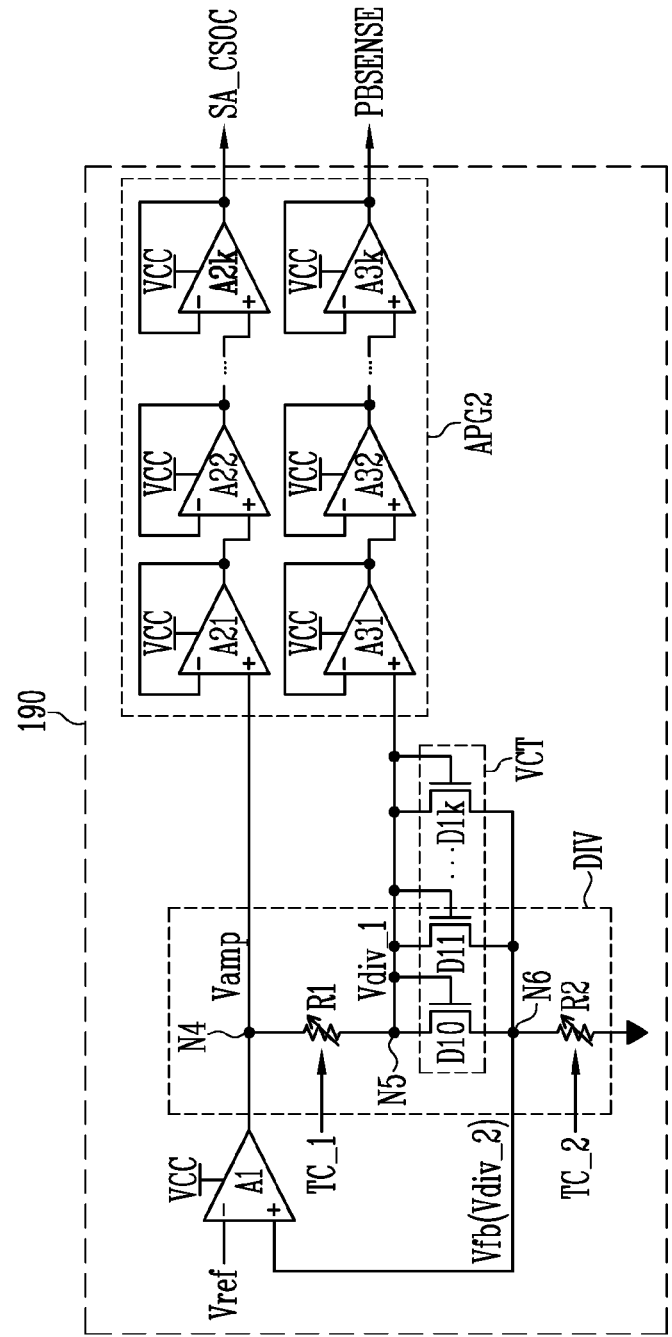
FIG. 6D is a circuit diagram illustrating a signal generator according to a fourth embodiment of the present disclosure.

FIG. 6D is a circuit diagram illustrating the signal generator 190 according to a fourth embodiment of the present disclosure.

Referring to FIG. 6D, the signal generator 190 according to the fourth embodiment may have a similar configuration to that of the third embodiment. Thus, a description of overlapping compositions with the third embodiment is omitted. In the fourth embodiment, the voltage regulator VCT may include a plurality of diodes D10 to D1k, where k is a positive integer. The plurality of diodes D10 to D1k may be coupled in parallel with each other between the fifth node N5 and the sixth node N6 and enable current to flow in the same direction. Each of the transistors included in the plurality of diodes D10 to D1k may be the same as the transistor of the third switch S3 of FIG. 4 included in the page buffer PBn of FIG. 4. For example, each of the transistors included in the plurality of diodes D10 to D1k may include the same material, structure, and size as the third switch S3 included in the page buffer PBn of FIG. 4, and may have the same threshold voltage as the third switch S3.

As there are more diodes D10 to D1k, the first divided voltage Vdiv_1 may be more stably output, so that dispersion or deviation of the sensing signal PBSENSE applied to the third switch S3 of the page buffer may be more reduced. In other words, as the number of diodes D10 to D1k increases, the sensing signal PBSENSE may maintain a more constant level.

Figure 7:
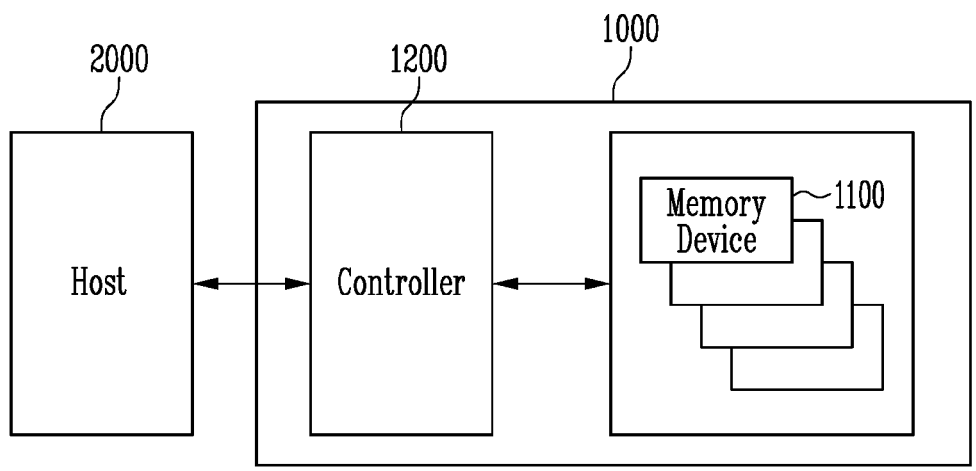
FIG. 7 is a diagram illustrating a memory system including memory devices according to an embodiment of the present disclosure.

FIG. 7 is a diagram illustrating an embodiment of a memory system 1000 including a plurality of memory devices 1100 according to an embodiment of the present disclosure.

Referring to FIG. 7, the memory system 1000 may include the memory devices 1100 configured to store data and a controller 1100 performing communications between the memory devices 1100 and a host 2000.

The memory system 1000 may include the plurality of memory devices 1100. Each of the memory devices 1100 may include the signal output circuit 180 and the page buffer group 140 as shown above in FIG. 1 of the present disclosure. The memory devices 1100 may be coupled to the controller 1200 through at least one channel. For example, the plurality of memory devices 1100 may be coupled to one channel. However, even when a plurality of channels are coupled to the controller 1200, the plurality of memory devices 1100 may be coupled to each of the channels.

The controller 1200 may perform communication between the host 2000 and the memory device 1100. The controller 1200 may control the memory device 1100 in response to a request of the host 2000, or may perform background operations for performance improvement of the memory system 1000 in the absence of a request from the host 2000. The host 2000 may generate requests for various operations and output the generated requests to the memory system 1000. Examples of these requests may include a program request for controlling a program operation, a read request for controlling a read operation, and an erase request for controlling an erase operation.

The host 2000 may communicate with the memory system 1000 by using various interfaces such as a Peripheral Component Interconnect-Express (PCI-E), Advanced Technology Attachment (ATA), Serial ATA (SATA), Parallel ATA (PATA), Universal Serial Bus (USB), MultiMedia Card (MMC), Enhanced Small Disk Interface (ESDI), or Integrated Drive Electronics (IDE).

Figure 8:
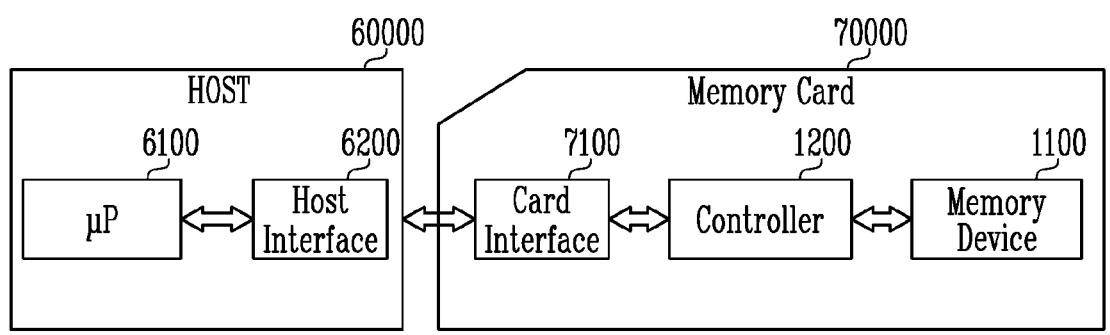
FIG. 8 is a diagram illustrating a memory system including a memory device according to an embodiment of the present disclosure.

FIG. 8 is a diagram illustrating another embodiment of a memory system including memory devices according to an embodiment of the present disclosure.

Referring to FIG. 8, a memory system 70000 may include a memory card or a smart card. The memory system 70000 may include the memory device 1100, a controller 1200, and a card interface 7100.

The controller 1200 may control data exchange between the memory device 1100 and the card interface 7100. According to an embodiment, the card interface 7100 may be, but is not limited to, a secure digital (SD) card interface or a multi-media card (MMC) interface.

Each of the memory devices 1100 may include the signal output circuit 180 and the page buffer group 140 as described above with reference to FIG. 1 of the present disclosure. The data stored in the memory device 1100 may be output through the card interface 7100 in response to control of the controller 1200.

The card interface 7100 may interface data exchange between a host 60000 and the controller 1200 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to an host interface 6200 of the host 60000 such as a PC, a tablet PC, a digital camera, a digital audio player, a cellular phone, a console video game hardware, or a digital set-top pox, the host interface 6200 may perform data communication with the memory device 1100 through the card interface 7100 and the controller 1200 in response to control of a microprocessor 6100.

According to the present disclosure, by preventing or mitigating reliability deterioration of a signal generator generating signals for controlling peripheral circuits, the reliability of the memory device including the signal output circuit may be improved.

It will be apparent to those skilled in the art that various modifications can be made to any of the above-described embodiments of the present teachings without departing from the spirit or scope of the teachings. Thus, it is intended that the present teachings cover all such modifications provided they come within the scope of the appended claims and their equivalents.

What is claimed is:

1. A memory device, comprising:
a memory block for storing data;
page buffers coupled to the memory block through bit lines; and
a signal generator configured to output a common sensing signal and a sensing signal included in page control signals for controlling the page buffers in response to an amplified voltage and a divided voltage generated through a single feedback loop,
wherein the page buffers are configured to precharge the bit lines, or sense a voltage or current in the bit lines in response to the page control signals including the common sensing signal and the sensing signal, and
wherein the signal generator comprises a divider circuit including at least one variable resistor and a voltage regulator, and configured to divide the amplified voltage to generate the divided voltage and a feedback voltage of the single feedback loop by the at least one variable resistor and the voltage regulator.

2. The memory device of claim 1, wherein the signal generator further comprises:
a first amplifier for outputting the amplified voltage in response to a reference voltage and the feedback voltage; and
a buffer group for outputting the common sensing signal in response to the amplified voltage and for outputting the sensing signal in response to the divided voltage.

3. The memory device of claim 2, wherein the at least one variable resistor comprises:
a first variable resistor; and
a second variable resistor,
wherein the first variable resistor, the voltage regulator, and the second variable resistor are coupled in series between an output node of the first amplifier and a ground terminal.

4. The memory device of claim 3,
wherein the divided voltage is divided between the first variable resistor and the voltage regulator, and
wherein the feedback voltage is divided between the voltage regulator and the second variable resistor.

5. The memory device of claim 3,
wherein the voltage regulator includes at least one diode for causing current to flow in a direction from the first variable resistor to the second variable resistor.

6. The memory device of claim 5,
wherein the at least one diode comprises at least one transistor having a same material, structure, and size as a switch operating in response to the sensing signal, among a plurality of switches included in the page buffers.

* * * * *